(12) United States Patent
Nishitani et al.

(10) Patent No.: US 8,773,212 B2
(45) Date of Patent: Jul. 8, 2014

(54) RESISTANCE-CAPACITANCE OSCILLATION CIRCUIT

(75) Inventors: Yu Nishitani, Kyoto (JP); Yukihiro Kaneko, Osaka (JP); Michihito Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 131 days.

(21) Appl. No.: 13/614,498

(22) Filed: Sep. 13, 2012

(65) Prior Publication Data

US 2013/0009713 A1 Jan. 10, 2013

Related U.S. Application Data

(63) Continuation of application No. PCT/JP2012/001435, filed on Mar. 2, 2012.

(30) Foreign Application Priority Data

Jun. 6, 2011 (JP) ................................. 2011-125977

(51) Int. Cl.
*H03B 5/20* (2006.01)
*H01L 49/02* (2006.01)

(52) U.S. Cl.
CPC ............ *H03B 5/20* (2013.01); *H03B 2200/004* (2013.01); *H03B 2201/02* (2013.01); *H03B 2201/0208* (2013.01); *H01L 28/20* (2013.01); *H01L 28/40* (2013.01)
USPC .................... 331/135; 331/108 B; 331/177 R; 331/177 V

(58) Field of Classification Search
CPC .............. H03B 5/20; H03B 5/24; H03B 5/26; H03B 2200/04; H03B 2201/02; H03B 2201/0208; H01L 28/20; H01L 28/40; H01L 27/11502; H01L 27/11509; H01L 27/222; H01L 29/685; H01L 27/0682; H01L 28/55; H01L 28/56

USPC ...... 331/108 B, 135, 136, 137, 177 R, 177 V; 257/595, 533, 532, 528, 536, 537, 257/E43.004, E21.004
See application file for complete search history.

(56) References Cited

U.S. PATENT DOCUMENTS 7,295,081 B2 * 11/2007 Forbes et al. ................. 331/135
8,339,208 B2 * 12/2012 Luong et al. ............ 331/117 FE
(Continued)

FOREIGN PATENT DOCUMENTS

EP 0 561 560 A1 9/1993
JP 03-036806 A 2/1991
(Continued)

OTHER PUBLICATIONS

Leibowitz, "Ladder Design for a Transistorized Phase-Shift Oscillator", Proceedings of the IEEE, vol. 55, Issue: 2, Feb. 1967, pp. 239-240.*

(Continued)

*Primary Examiner* — Ryan Johnson
(74) *Attorney, Agent, or Firm* — McDermott Will & Emery LLP

(57) ABSTRACT

A resistance-capacitance oscillation circuit comprises an amplifier and a phase shifting circuit. The phase shifting circuit comprises at least three resistance-capacitance circuit elements, which comprise a resistance and a capacitance. At least one of the resistance-capacitance circuit elements comprises a variable resistance and a variable capacitance. The variable resistance is formed of a first electrode, a second electrode, a part of a semiconductor film, a part of a ferroelectric film, and a fourth electrode. The variable capacitor is formed of the second electrode, a third electrode, a fifth electrode, another part of the ferroelectric film, another part of the semiconductor film, and a paraelectric film.

4 Claims, 5 Drawing Sheets

(56) References Cited

U.S. PATENT DOCUMENTS

| | | |
|---|---|---|
| 2008/0100391 A1* | 5/2008 | Lim et al. ............... 331/143 |
| 2008/0150646 A1 | 6/2008 | Chen |
| 2009/0290404 A1 | 11/2009 | Kaneko et al. |
| 2010/0328839 A1 | 12/2010 | Kanno et al. |
| 2012/0146739 A1* | 6/2012 | Ribeiro et al. ............ 331/167 |

FOREIGN PATENT DOCUMENTS

| | | |
|---|---|---|
| JP | 03-178205 A | 8/1991 |
| JP | 06-124394 A | 5/1994 |
| JP | 2002-258880 A | 9/2002 |
| JP | 2008-160798 A | 7/2008 |
| JP | 2009-212168 A | 9/2009 |
| JP | 2009-295255 A | 12/2009 |
| JP | 2010267705 A * | 11/2010 |
| WO | WO-2010/131310 A1 | 11/2010 |

OTHER PUBLICATIONS

International Search Report issued in International Patent Application No. PCT/JP2012/001435 dated Apr. 3, 2012.

* cited by examiner

RESISTANCE-CAPACITANCE OSCILLATION CIRCUIT

This is a continuation of International Application No. PCT/JP2012/001435, with an international filing date of Mar. 2, 2012, which claims priority of Japanese Patent Application No. 2011-125977, filed on Jun. 6, 2011, the contents of which are hereby incorporated by reference.

TECHNICAL FIELD

The present invention relates to a resistance-capacitance oscillation circuit.

BACKGROUND ART

FIG. 5 shows a conventional resistance-capacitance oscillation circuit (hereinafter, referred to as an "RC oscillation circuit") as disclosed in Patent Literature 1 (particularly, FIG. 2(b)). This conventional RC oscillation circuit comprises an amplifier 1 and a phase shifting circuit 2. The phase shifting circuit 2 comprises at least three RC circuit elements 31 each composed of one resistance and one capacitor. In FIG. 5, a first RC circuit element 31a, a second RC circuit element 31b, and a third RC circuit element 31c are provided. As shown in FIG. 5, the first to third RC circuit elements 31a to 31c comprise first to third resistances 41a to 41c and first to third capacitors 51a to 51c.

The output terminal of the amplifier 1 is connected to one terminal of the first capacitor 51a. The other terminal of the first capacitor 51a is connected to one terminal of the second capacitor 51b through a first node 61a. One terminal of the first resistance 41a is connected to the first node 61a. The other terminal of the first resistance 41a is grounded.

The other terminal of the second capacitor 51b is connected to one terminal of the third capacitor 51c through a second node 61b. One terminal of the second resistance 41b is connected to the second node 61b. The other terminal of the second resistance 41b is grounded.

The other terminal of the third capacitor 51c is connected to the input terminal of the amplifier 1 through a third node 61c. The one terminal of the third resistance 41c is connected to the third node 61c. The other terminal of the third resistance 41c is grounded.

When the amplifier 1 is turned on, the RC oscillation circuit oscillates at a predetermined oscillation frequency according to the resistance value of each of resistances 41a to 41c and on the capacitance value of each of capacitors 51a to 51c.

Patent Literature 2 (which corresponds to US Pre-Grant Patent Application Publication No. 2008/0150646) discloses an RC oscillator using a variable resistance and a variable capacitor.

CITATION LIST

Patent Literatures

[Patent Literature 1]

Japanese Laid-Open Patent Application Publication No. 2002-258880

[Patent Literature 2]

Japanese Laid-Open Patent Application Publication No. 2008-160798

SUMMARY OF INVENTION

Technical Problem

The purpose of the present invention is to provide a novel and nonvolatile RC oscillation circuit capable of modulating a oscillation frequency in a wide range.

Solution to Problem

The present invention provides a resistance-capacitance oscillation circuit, comprising:
  an amplifier; and
  a phase shifting circuit, wherein
  the amplifier comprises an output terminal and an input terminal;
  the phase shifting circuit comprises at least three resistance-capacitance circuit elements,
  each resistance-capacitance circuit element comprises a resistance and a capacitor;
  the capacitors are electrically connected in series between the output terminal and the input terminal;
  at least one of the RC circuit elements is a variable RC circuit element composed of a variable resistance and a variable capacitor;
  the variable resistance-capacitance circuit element comprises a first electrode, a second electrode, a third electrode, a fourth electrode, and a fifth electrode, a ferroelectric film, a semiconductor film, and a paraelectric film,
  Z axis denotes a direction of the normal line of the ferroelectric film;
  X axis denotes a direction orthogonal to the Z axis;
  the ferroelectric film and the semiconductor film are stacked along the Z axis;
  the first electrode, the second electrode, and the paraelectric film are disposed on the obverse surface of the semiconductor film;
  the second electrode is interposed between the first electrode and the paraelectric film along the X axis;
  the fourth electrode and the fifth electrode are disposed on the reverse surface of the ferroelectric film;
  the fourth electrode is electrically insulated from the fifth electrode; the fourth electrode is interposed between the first electrode and the second electrode in a perspective view along the Z axis;
  the variable resistance is formed of the first electrode, the second electrode, a part of the ferroelectric film, a part of the semiconductor film, and the fourth electrode;
  another part of the ferroelectric film, another part of the semiconductor film, and the paraelectric film are interposed between the third electrode and the fifth electrode;
  the variable capacitor is formed of the second electrode, the third electrode, the fifth electrode, the another part of the ferroelectric film, the another part of the semiconductor film, and the paraelectric film.

Advantageous Effects of the Invention

According to the present invention, it is possible to provide a novel and nonvolatile RC oscillation circuit capable of modulating an oscillation frequency in a wide range.

DESCRIPTION OF EMBODIMENTS (Embodiment)

An embodiment of an RC oscillation circuit according to the present invention is hereinafter described with reference to the drawings.

Figure 1:
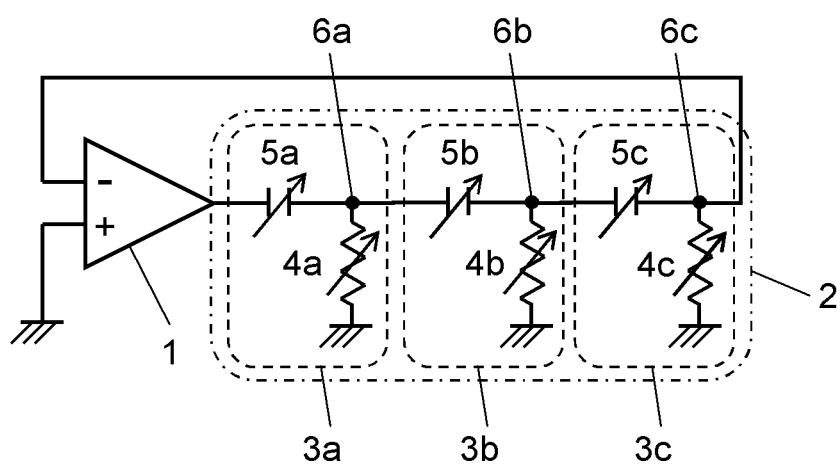
FIG. 1 shows a schematic diagram of an RC oscillation circuit according to an embodiment.

FIG. 1 shows a schematic diagram of an RC oscillation circuit according to the present embodiment. This RC oscillation circuit comprises an amplifier 1 and a phase shifting circuit 2. The phase shifting circuit 2 comprises three or more RC circuit elements 3. Among them, one or more RC oscillation circuit(s) is/are a variable RC circuit element(s) 3. The other RC oscillation circuit(s) may be an RC circuit element(s) each having a fixed resistance value and a fixed capacitance value. As shown in FIG. 1, all the RC circuit elements included in the phase shifting circuit 2 may be variable RC circuit elements 3. Here, three variable RC circuit element 3 is expressed as 3a, 3b, 3c.

In FIG. 1, the phase shifting circuit 2 comprises a first variable RC circuit element 3a, a second variable RC circuit element 3b, and a third variable RC circuit element 3c. As shown in FIG. 1, the first to third variable RC circuit elements 3a to 3c comprise first to third variable resistances 4a to 4c and first to third variable capacitors 5a to 5c.

The output terminal of the amplifier 1 is connected to one terminal of the first variable capacitor 5a. The other terminal of the first variable capacitor 5a is connected to one terminal of the second variable capacitor 5b through a first node 6a. One terminal of the first variable resistance 4a is connected to the first node 6a. The other terminal of the first variable resistance 4a is grounded.

The other terminal of the second variable capacitor 5b is connected to one terminal of the third variable capacitor 5c through a second node 6b. One terminal of the second variable resistance 4b is connected to the second node 6b. The other terminal of the second variable resistance 4b is grounded.

The other terminal of the third variable capacitor 5c is connected to an input terminal of the amplifier 1 through a third node 6c. One terminal of the third variable resistance 4c is connected to the third node 6c. The other terminal of the third variable resistance 4c is grounded.

As shown in FIG. 1, the variable capacitor 5a to 5c are electrically connected in series between the output terminal and the input terminal of the amplifier 1.

Next, the structure of the variable RC circuit element 3 is described in more detail.

Figure 2A:
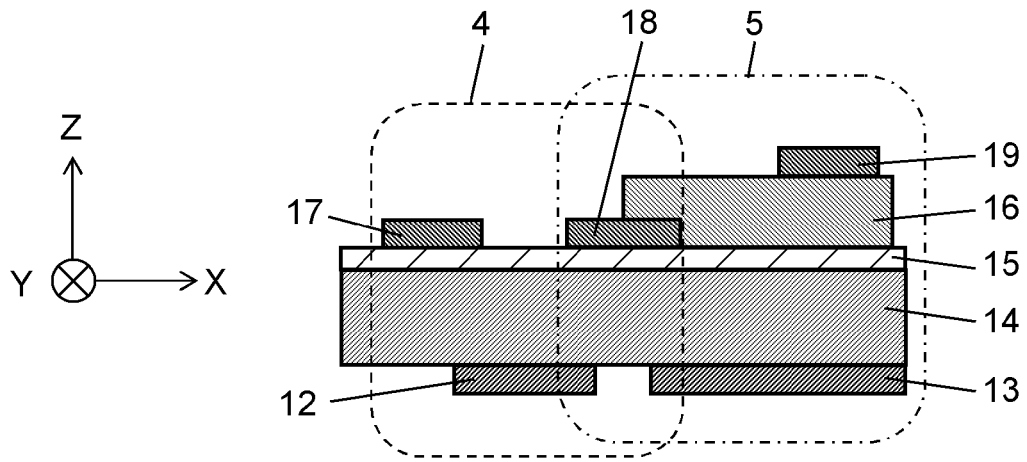
FIG. 2A shows a cross-sectional view of a variable RC circuit element according to the embodiment.
Figure 2B:
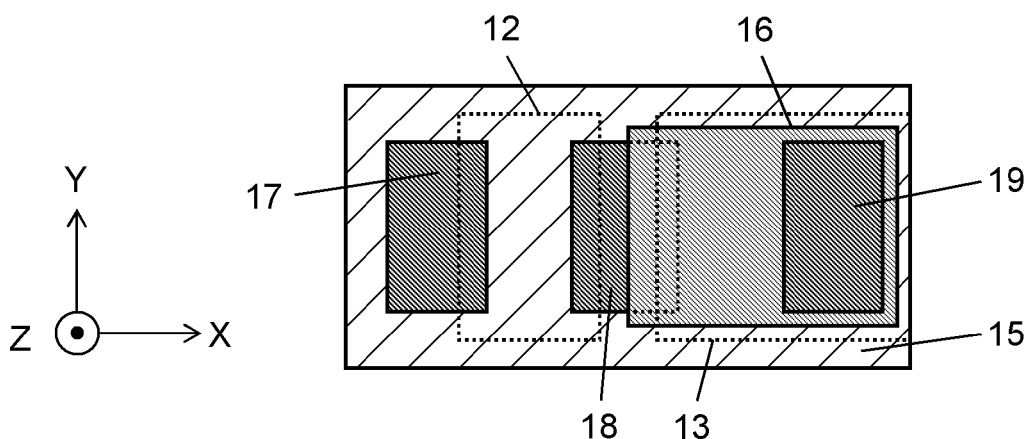
FIG. 2B shows a perspective view of the variable RC circuit element according to the embodiment as viewed from a Z-axis direction.
Figure 2C:
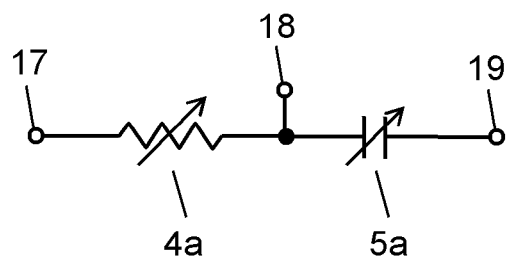
FIG. 2C shows an equivalent circuit schematic of the variable RC circuit element according to the embodiment.

FIG. 2A, FIG. 2B, and FIG. 2C show a cross-sectional view, a perspective view along a Z axis, and an equivalent circuit schematic of the variable RC circuit element 3, respectively. The variable RC circuit element 3 comprises a first electrode 17, a second electrode 18, a third electrode 19, a fourth electrode 12, a fifth electrode 13, a ferroelectric film 14, a semiconductor film 15, and a paraelectric film 16. The Z axis denotes the direction of the normal line of the ferroelectric film 14. The X axis denotes the direction orthogonal to the Z axis. The Y axis denotes the direction orthogonal to both of the Z axis and the X axis.

An example of the first to fifth electrodes 17 to 13 is a laminate composed of a platinum film and a titanium film.

Examples of the material of the ferroelectric film 14 include $Pb(Zr,Ti)O_3$, $Sr(Bi,Ta)O$, or $Bi_{12}TiO_{20}$.

Examples of the material of the semiconductor film 15 include ZnO, GaN, or InGaZnO.

The ferroelectric film 14 and the semiconductor film 15 are stacked along the Z axis. The first electrode 17, the second electrode 18, and the paraelectric film 16 are disposed on the obverse surface of the semiconductor film 15. The second electrode 18 is interposed between the first electrode 17 and the paraelectric film 16 along the X axis. The fourth electrode 12 and the fifth electrode 13 are disposed on the reverse surface of the ferroelectric film 14. The fourth electrode 12 is interposed between the first electrode 17 and the second electrode 18 in the perspective view along the Z axis.

The variable resistance 4 is formed of the first electrode 17, the second electrode 18, a part of the ferroelectric film 14, a part of the semiconductor film 15, and the fourth electrode 12.

Another part of the ferroelectric film 14, another part of the semiconductor film 15, and the paraelectric film 16 are interposed between the third electrode 19 and the fifth electrode 13. The variable capacitor 5 is formed of the second electrode 18, the third electrode 19, the fifth electrode 13, the another part of the ferroelectric film 14, the another part of the semiconductor film 15, and the paraelectric film 16.

Next, a method of oscillating the RC oscillation circuit according to the present embodiment is described below.

When the amplifier 1 is turned on, the RC oscillation circuit oscillates at a predetermined oscillation frequency $f_0$ represented by the following Equation 1, according to both of the resistance value of each of the variable resistances 4a to 4c and the capacitance value of each of variable capacitors 5a to 5c as shown in Equation 1.

$$f_0 = \frac{1}{2\pi\sqrt{\begin{array}{l}R_1R_2(C_1C_2 + C_2C_3 + C_3C_1) + \\ R_3R_1(C_2C_3 + C_3C_1) + R_2R_3C_2C_3\end{array}}}$$ [Equation 1]

$R_1$, $R_2$, and $R_3$ represent the resistance values of the variable resistances 4a, 4b, and 4c, respectively.

$C_1$, $C_2$, and $C_3$ represent the capacitance values of the variable capacitors 5a, 5b, and 5c, respectively.

As shown in FIG. 2C, the resistance value of the variable resistance 4a corresponds to the value of the resistance formed between the first electrode 17 and the second electrode 18. The capacitance value of the variable capacitor 5a corresponds to the value of the capacitance formed between the second electrode 18 and the third electrode 19.

Based on the Equation 1, modulation of the oscillation frequency is achieved by adjusting the resistance value of each of the variable resistances 4a to 4c and the capacitance value of each of the variable capacitors 5a to 5c.

Next, a procedure for adjusting the resistance value of each of the variable resistances 4a to 4c and the capacitance value of each of the variable capacitors 5a to 5c to the predetermined values is described in more detail.

Figure 3A:
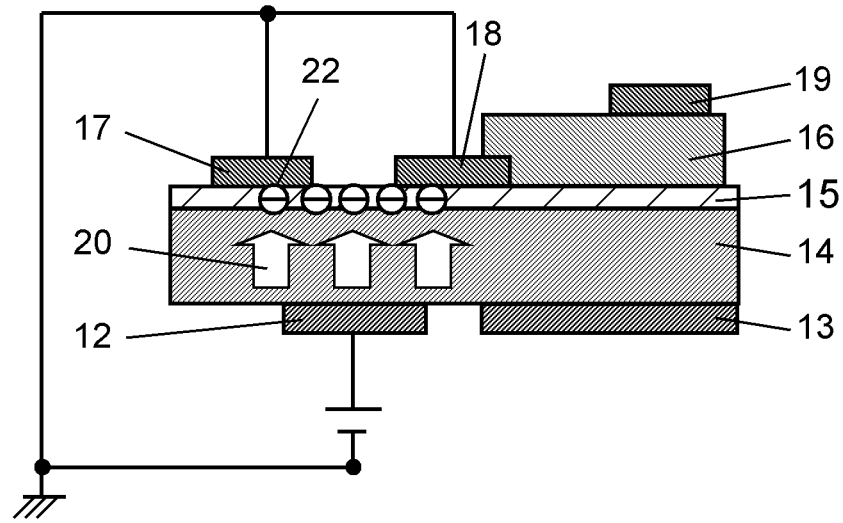
FIG. 3A illustrates a procedure for adjusting a resistance value of a variable resistance to a predetermined value according to the embodiment.

FIG. 3A illustrates a state where a positive potential is applied to the fourth electrode 12 with respect to at least one electrode selected from the first electrode 17 and the second electrode 18 so as to cause a direction of the spontaneous polarization 20 of the ferroelectric film 14 to be oriented toward to the semiconductor film 15. In this state, electrons 22 are accumulated in an interface formed between the ferroelectric film 14 and the semiconductor film 15 due to the electric coupling with the spontaneous polarization 20. As a result, the resistance value between the first electrode 17 and the second electrode 18 is lowered.

Figure 3B:
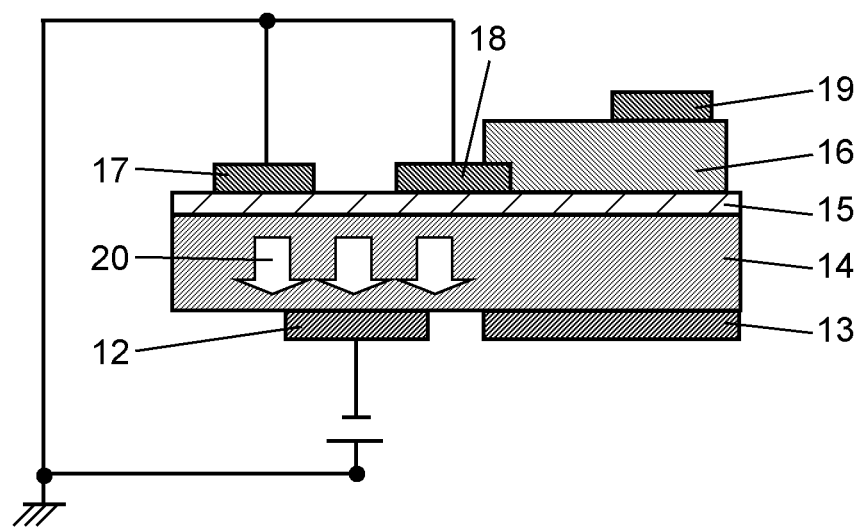
FIG. 3B illustrates a procedure for adjusting a resistance value of the variable resistance to a predetermined value according to the embodiment.

On the other hand, FIG. 3B illustrates a state where a negative potential is applied to the fourth electrode 12 with respect to at lease one electrode selected from the first electrode 17 and the second electrode 18 so as to cause the direction of the spontaneous polarization 20 of the ferroelectric film 14 to be oriented toward to the fourth electrode 12. In this state, the interface formed between the ferroelectric film 14 and the semiconductor film 15 is depleted by the repulsion generated between the spontaneous polarization 20 and electrons. As a result, the resistance value between the first electrode 17 and the second electrode 18 is increased.

The amount of the accumulated electrons 22 is varied continuously, depending on the ratio of the spontaneous polarization oriented toward the semiconductor film 15 to all the spontaneous polarization 20. This means that the resistance value is varied continuously according to the value of the applied potential. Thus, on the basis of the resistance value required to the variable resistance 4, a potential difference is applied between at least one electrode selected from the first electrode 17 and the second electrode 18 and the fourth electrode 12.

After the applied potential difference is removed, the direction of the spontaneous polarization 20 is unchanged due to the nonvolatility of the ferroelectric film 14. Accordingly, the resistance value is retained. This means that the variable resistance 4 is nonvolatile.

Figure 4A:
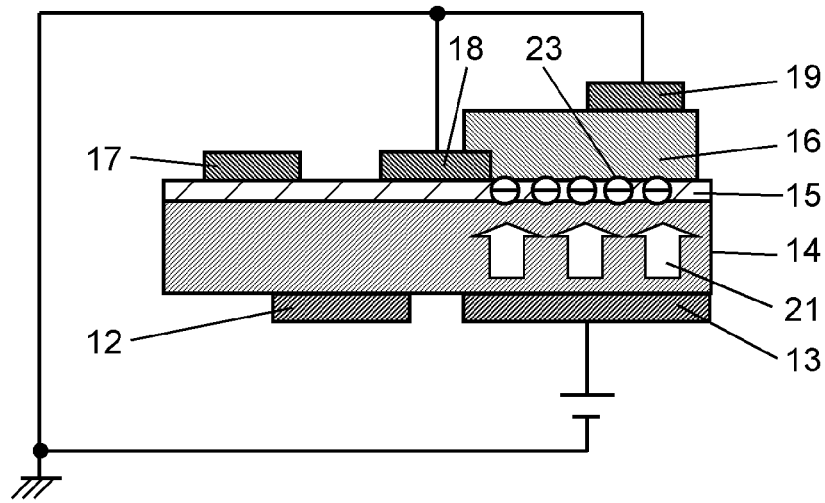
FIG. 4A illustrates a procedure for adjusting a capacitance value of a variable capacitor to a predetermined value according to the embodiment.

FIG. 4A illustrates a state where a positive potential is applied to the fifth electrode 13 with respect to at least one electrode selected from the second electrode 18 and the third electrode 19 so as to cause a direction of the spontaneous polarization 21 of the ferroelectric film 14 to be oriented toward to the semiconductor film 15. In this state, electrons 23 are accumulated in the interface formed between the ferroelectric film 14 and the semiconductor film 15 due to the electric coupling with the spontaneous polarization 21. Since the accumulated electrons 23 act like an electrode, the accumulation of the electrons increase the virtual area of the second electrode 18. It is well-known that the larger an area of an electrode included in a capacitor is, the greater the capacitance value of the capacitor is. As a result, the capacitance value between the second electrode 18 and the third electrode 19 is increased.

Figure 4B:
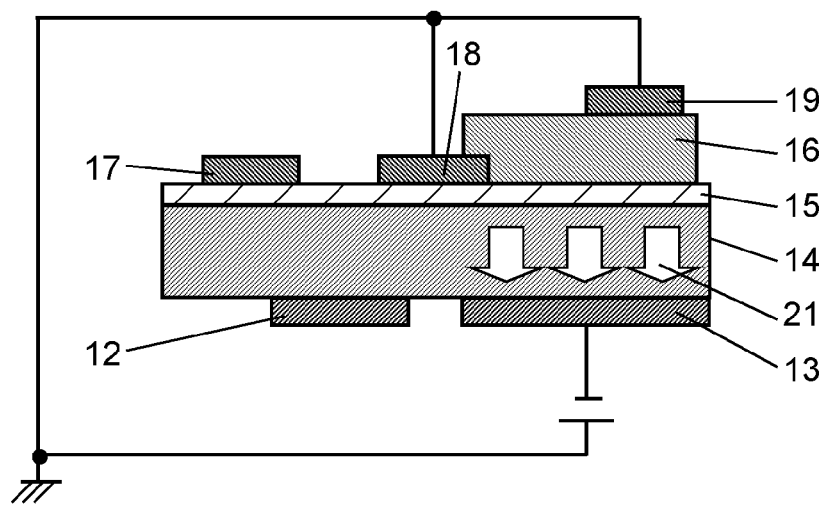
FIG. 4B illustrates a procedure for adjusting a capacitance value of a variable capacitor to a predetermined value according to the embodiment.
Figure 5:
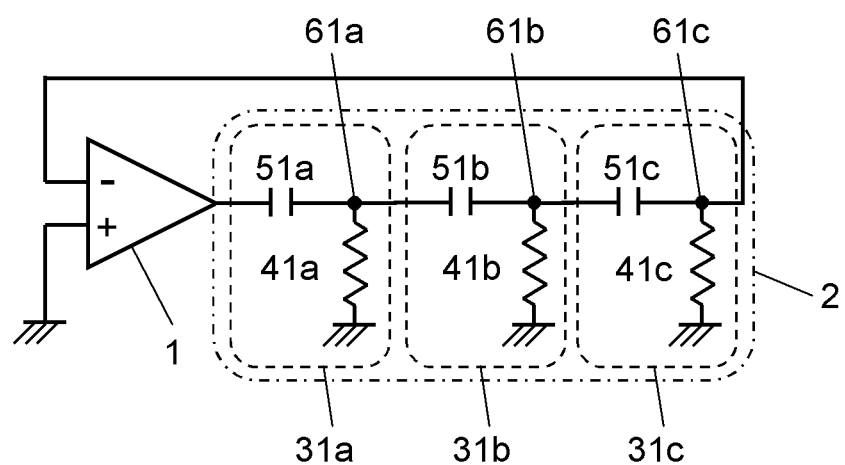
FIG. 5 shows a schematic diagram of a conventional RC oscillation circuit.

On the other hand, FIG. 4B illustrates a state where a negative potential is applied to the fifth electrode 13 with respect to at least one electrode selected from the second electrode 18 and the third electrode 19 so as to cause the direction of the spontaneous polarization 21 to be oriented toward the fifth electrode 13. In this state, the interface formed between the ferroelectric film 14 and the semiconductor film 15 is depleted by the repulsion generated between the spontaneous polarization 21 and electrons. As a result, the capacitance value is lowered.

The amount of the accumulated electrons 23 is varied continuously, depending on the ratio of the spontaneous polarization oriented toward the semiconductor film 15 to all the spontaneous polarization 21. This means that the resistance value is varied continuously according to the value of the applied potential. Thus, on the basis of the capacitance value required to the variable capacitor 5, a potential difference is applied between at lease one electrode selected from the second electrode 18 and the third electrode 19 and the fifth electrode 13.

After the applied potential difference is removed, the direction of the spontaneous polarization 21 is unchanged due to the nonvolatility of the ferroelectric film 14. Accordingly, the capacitance value is retained. This means that the variable capacitor 5 is nonvolatile.

As described above, the resistance value and the capacitance value are adjusted independently. First, the resistance value is adjusted, as is clear from the example, which is described later, so as to modulate the oscillation frequency roughly. Then, the capacitance value is adjusted to modulate the oscillation frequency accurately.

As shown in FIG. 2A, since the resistance 4 and the capacitor 5 share the second electrode 18, it is necessary that the fourth electrode 12 is electrically insulated from the fifth electrode 13. In case where the fourth electrode 12 is electrically connected to the fifth electrode 13, the resistance value and the capacitance value fails to be adjusted independently. This causes the oscillation frequency to fail to be adjusted to the predetermined value.

It is necessary that the first electrode 17 is electrically insulated through the variable resistance 4 from the second electrode 18, as shown in FIG. 2C. In case where the first electrode 17 is electrically connected to the second electrode 18 without the resistance, the variable resistance 4 fails to work.

EXAMPLE

The present invention is described below in more detail with reference to the following example.
(Preparation of the Variable RC Circuit Element 3)

A conducting film having a thickness of 30 nanometers made of strontium ruthenium oxide ($SrRuO_3$, hereinafter referred to as "SRO") was deposited on a (001) single crystal substrate made of strontium titanate ($SrTiO_3$; hereinafter, referred to as "STO") with a pulsed laser deposition technique (hereinafter, referred to as "PLD"). The temperature of the substrate during the deposition was 700 degrees Celsius. After the deposition, the fourth electrode 12 and the fifth electrode 13 were formed with photolithography and with a wet etching technique.

A ferroelectric film 14 made of lead zirconate titanate ($Pb(Zr,Ti)O_3$; hereinafter referred to as "PZT") having a thickness of 450 nanometers was deposited on the SRO film with the PLD under the condition that the temperature of the substrate was 700 degrees Celsius. Subsequently, the temperature of the substrate was decreased to 400 degrees Celsius. Then, a semiconductor film 15 made of zinc oxide (ZnO) having a thickness of 30 nanometers was deposited.

After a patterned photoresist was formed on the semiconductor film 15, a laminate composed of a titanium film having a thickness of 5 nanometers and a platinum film having a thickness of 30 nanometers was deposited with an electron-beam deposition technique at room temperature. After the deposition, the first electrode 17 and the second electrode 18 were formed with a lift-off technique.

A silicone nitride paraelectric film 16 having a thickness of 100 nanometers was deposited with a high-frequency sputtering technique at room temperature on the semiconductor film 15, the first electrode 17 and the second electrode 18. After the deposition, an unnecessary part was removed with photolithography and a dry etching technique. After the patterned photoresist was formed on the paraelectric film 16, a laminate composed of a Ti film having a thickness of 5 nanometers and a Pt film having a thickness of 30 nanometers was deposited with an electron-beam deposition technique at room temperature. After the deposition, the third electrode 19 was formed with a lift-off technique. In this manner, the variable RC circuit element 3 was obtained.

(Evaluation of the Variable RC Circuit Element)

After 0 volts, 0 volts, and −5 volts were applied to the first electrode 17, the second electrode 18, and the fourth electrode 12 respectively, the value of the resistance 4 generated between the first electrode 17 and the second electrode 18 was measured. The resultant resistance value was 10.6 giga-ohms.

After 0 volts, 0 volts, and +5 volts were applied to the first electrode 17, the second electrode 18, and the fourth electrode 12 respectively, the value of the resistance 4 generated between the first electrode 17 and the second electrode 18 was measured. The resultant resistance value was 2.52 kilo-ohms.

After 0 volts, 0 volts, and −10 volts were applied to the second electrode 18, the third electrode 19, and the fifth electrode 13 respectively, the value of the capacitance generated between the second electrode 18 and the third electrode 19 was measured. The resultant capacitance value was 3.62 pico-farad.

After 0 volts, 0 volts, and +10 volts were applied to the second electrode 18, the third electrode 19, and the fifth electrode 13 respectively, the value of the capacitance generated between the second electrode 18 and the third electrode 19 was measured. The resultant capacitance value was 6.79 pico-farad.

(Preparation and Evaluation of the RC Oscillation Circuit)

Using the three variable RC circuit elements 3a, 3b, 3c thus obtained and an amplifier 1, the RC oscillation circuit shown in FIG. 1 was obtained. After the resistance value and the capacitance value were varied as shown in Table 1, the amplifier 1 was turned on. The resultant oscillation frequency is shown in Table 1.

TABLE 1

| Resistance value of first variable resistance 4a | Capacitance value of first variable capacitor 5a | |
| Resistance value of second variable resistance 4b | Capacitance value of second variable capacitor 5b | |
| Resistance value of third variable resistance 4c | Capacitance value of third variable capacitor 5c | Oscillation frequency |
| 10.6 giga-ohms | 3.62 pico-farad | 1.69 Hz |
| 2.52 kiro-ohms | 3.62 pico-farad | 7.12 MHz |
| 2.52 kiro-ohms | 6.79 pico-farad | 3.80 MHz |

According to these results, the oscillation frequency is roughly modulated to a value falling within a range from a few Hz to a few MHz by firstly adjusting the resistance value of each of the variable resistances 4a to 4c. Next, the oscillation frequency is accurately modulated by adjusting the capacitance value of each of the variable capacitors 5a to 5c.

INDUSTRIAL APPLICABILITY

The RC oscillation circuit according to the present invention can be used as a reference clock of microcomputers.

REFERENCE SIGNS LIST

1 Amplifier
2 Phase Shifting Circuit
3a to 3c Variable Resistance-Capacitance Circuit Element
4a to 4c Variable Resistance
5a to 5c Variable Capacitor
6a to 6c Node
31a to 31c Resistance-Capacitance Circuit Element
41a to 41c Resistance
51a to 51c Capacitor
61a to 61c Node
12 Fourth Electrode
13 Fifth Electrode
14 Ferroelectric Film
15 Semiconductor Film
16 Paraelectric Film
17 First Electrode
18 Second Electrode
19 Third Electrode
20 Spontaneous Polarization of a Part of Ferroelectric Film 14
21 Spontaneous Polarization of Another Part of Ferroelectric Film 14
22 Electrons Accumulated at a Part of Interface Between a Ferroelectric Film 14 and a Semiconductor Film 15
23 Electrons Accumulated at Another Part of Interface Between a Ferroelectric Film 14 and a Semiconductor Film 15

The invention claimed is:

1. A resistance-capacitance oscillation circuit, comprising:
an amplifier; and
a phase shifting circuit, wherein
the amplifier comprises an output terminal and an input terminal;
the phase shifting circuit comprises at least three resistance-capacitance circuit elements,
each resistance-capacitance circuit element comprises a resistance and a capacitor;
the capacitors are electrically connected in series between the output terminal and the input terminal;
at least one of the RC circuit elements is a variable RC circuit element composed of a variable resistance and a variable capacitor;
the variable resistance-capacitance circuit element comprises a first electrode, a second electrode, a third electrode, a fourth electrode, and a fifth electrode, a ferroelectric film, a semiconductor film, and a paraelectric film,
Z axis denotes a direction of the normal line of the ferroelectric film;
X axis denotes a direction orthogonal to the Z axis;
the ferroelectric film and the semiconductor film are stacked along the Z axis;
the first electrode, the second electrode, and the paraelectric film are disposed on the obverse surface of the semiconductor film;
the second electrode is interposed between the first electrode and the paraelectric film along the X axis;

the fourth electrode and the fifth electrode are disposed on the reverse surface of the ferroelectric film;

the fourth electrode is electrically insulated from the fifth electrode;

the fourth electrode is interposed between the first electrode and the second electrode in a perspective view along the Z axis;

the variable resistance is formed of the first electrode, the second electrode, a part of the ferroelectric film, a part of the semiconductor film, and the fourth electrode;

another part of the ferroelectric film, another part of the semiconductor film, and the paraelectric film are interposed between the third electrode and the fifth electrode;

the variable capacitor is formed of the second electrode, the third electrode, the fifth electrode, the another part of the ferroelectric film, the another part of the semiconductor film, and the paraelectric film.

2. A method for oscillating a resistance-capacitance oscillation circuit, the method comprising steps of:
(a) preparing the resistance-capacitance oscillation circuit according to claim 1; and
(b) turning on the amplifier to oscillate the resistance-capacitance oscillation circuit at an oscillation frequency according to the resistance value of the variable resistance and the capacitance value of the variable capacitor.

3. A method for oscillating a resistance-capacitance oscillation circuit, the method comprising steps of:
(a) preparing the resistance-capacitance oscillation circuit according to claim 1;
(b) applying a potential difference between at least one electrode selected from the first electrode and the second electrode and the fourth electrode (12) to adjust the resistance value of the variable resistance to a predetermined value;
(c) applying a potential difference between at least one electrode selected from the second electrode and the third electrode and the fifth electrode to adjust the capacitance value of the variable capacitor to a predetermined value; and
(d) turning on the amplifier to oscillate the resistance-capacitance oscillation circuit at an oscillation frequency according to the resistance value adjusted in the step (b) and the capacitance value adjusted in the step (c).

4. A method for adjusting an oscillation frequency, the method comprising steps of:
(a) preparing the resistance-capacitance oscillation circuit according to claim 1;
(b) applying a potential difference between at least one electrode selected from the first electrode and the second electrode and the fourth electrode to adjust the resistance value of the variable resistance to a predetermined value; and
(c) applying a potential difference between at least one electrode selected from the second electrode and the third electrode and the fifth electrode to adjust the capacitance value of the variable capacitor to a predetermined value.

* * * * *